United States Patent [19]

Lemley

[11] 4,338,560
[45] Jul. 6, 1982

[54] ALBEDD RADIATION POWER CONVERTER

[75] Inventor: Leo W. Lemley, Bethesda, Md.

[73] Assignee: The United States of America as represented by the Secretary of the Navy, Washington, D.C.

[21] Appl. No.: 84,253

[22] Filed: Oct. 12, 1979

[51] Int. Cl.$^3$ ............................................. H02L 1/00
[52] U.S. Cl. .................................. 322/2 A; 136/202; 136/205; 136/206; 310/306; 310/308
[58] Field of Search ............... 136/200, 202, 205, 206, 136/208; 250/211 R; 310/306, 308; 322/2 R, 2 A

[56] References Cited

U.S. PATENT DOCUMENTS

| | | | |
|---|---|---|---|
| 3,781,647 | 12/1973 | Glaser | 310/306 |
| 3,818,304 | 6/1974 | Hursen et al. | 136/202 X |
| 3,899,359 | 8/1975 | Stachurski | 136/205 |
| 3,931,532 | 1/1976 | Byrd | 136/202 |
| 3,971,938 | 7/1976 | O'Hare | 250/211 R |
| 4,087,735 | 5/1978 | O'Hare | 250/211 R |
| 4,220,906 | 9/1980 | Drummond | 310/308 |

Primary Examiner—Leland A. Sebastian
Attorney, Agent, or Firm—Robert F. Beers; William T. Ellis; Vincent J. Ranucci

[57] ABSTRACT

A heat-to-electricity converter, particularly adaptable for use by high-altitude platforms such as aerostats and space stations, for changing heat energy of radiation from the earth to electric power during day and/or night. The converter includes an array of heat-collector sources and radiator heat sinks interconnected by thermoelectric n– and p– doped material elements. The array is fabricated on thin films of plastic and may be mounted on a high-altitude platform. The collectors absorb infrared (IR) heat from the earth and conduct the heat to the thermoelectric elements. The elements convert the heat to electricity. The absorbed heat less the heat converted to electricity is emitted to space by the radiator heat sinks.

20 Claims, 2 Drawing Figures

ALBEDO RADIATION POWER CONVERTER

BACKGROUND OF THE INVENTION

This invention relates generally to the conversion of heat to electricity and more particularly to a power converter for converting the earth's albedo, that is, the infrared radiation of the earth, to direct current (dc) power during day and/or night for use by high-altitude platforms for propulsion, sensors, or other power requirements.

Pivotal in the development of a high-altitude vehicle station keeping platform, has been the source of energy for night operation. During the day, a light-weight solar array can convert energy from the sun into power for operation in wind conditions. However, at night powered balloons have historically relied upon chemical storage batteries that are heavy despite attempts to introduce high energy density (~155 watt-hours/kg). Under most favorable conditions such batteries account for 60% of the payload. Thus, most high-altitude platforms depend upon solar arrays, chemical batteries, or depletable fuels for power sources. Solar arrays are expensive and operate under direct solar illumination, not in the earth's eclipse (night). Chemical batteries for night operation are heavy and have a limited lifetime. Depletable fuels (including gases) have a limited life application.

Overlooked in a search for a night energy source has been the earth's albedo which has plagued balloonists by heating balloons under undesirable conditions.

SUMMARY OF THE INVENTION

It is the general purpose and object of the present invention to convert infrared radiation to electric power, especially for use by high-altitude platforms during day and/or night. Another object is to provide a source of electric power which can be easily and inexpensively manufactured. These and other objects of the present invention are accomplished by an array of energy collectors, for absorbing radiation and being a source of heat, thermoelectric elements for generating electricity from the heat, and radiators for emitting excess energy and being a heat sink. The thermoelectric elements link the collector sources and the radiator sinks, and provide a series of dc electric power sources.

The albedo power converter has advantages over existing power sources because it can operate in or out of the earth's eclipse (day or night) by deriving its power from the earth's temperature. The present invention does not deplete nor will it wear out because there is no fuel or moving parts. It also has a competitive power density (148 to 183 watts/kg).

Other objects and advantages of the present invention will become apparent from the following detailed description of the invention when considered in conjunction with the accompanying drawing wherein:

DETAILED DESCRIPTION OF THE INVENTION

Figure 1:
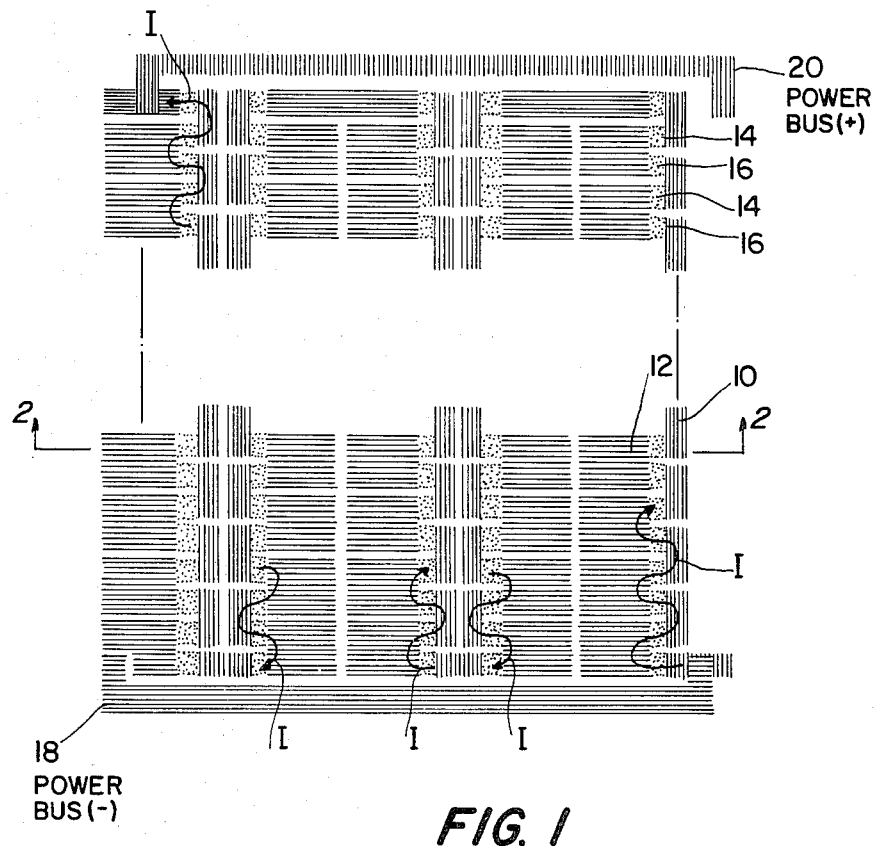
FIG. 1 is a plan view of an illustrative embodiment of the present invention.

Referring now to the drawing, wherein like reference characters designate like or corresponding parts throughout the views, FIG. 1 shows an array of thermal collectors 10 and thermal radiators 12 interconnected by alternate thermoelectric elements of dissimilar metals, such as n— and p— doped elements, 14 and 16 respectively. The array forms a thermoelectric chain between a negative power bus 18 and a positive power bus 20. The chain conducts electric current I between the buses for providing a source of electricity.

Figure 2:
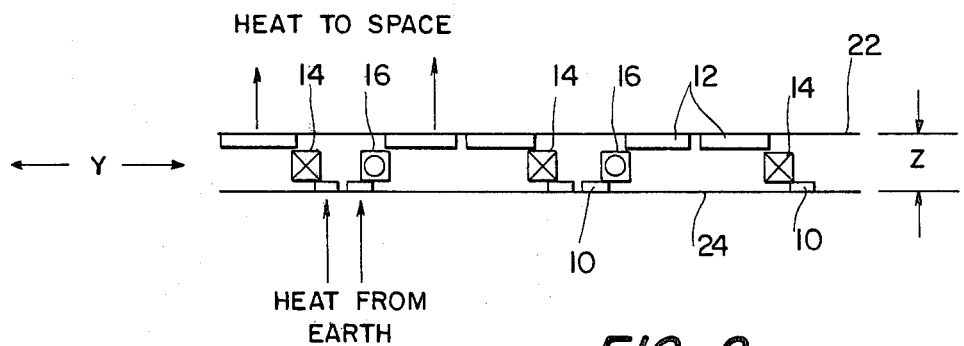
FIG. 2 is a cross-sectional view taken along the line 2—2 of FIG. 1 and shows the layered interconnections among the collectors, thermoelectric elements and radiators.

The array is constructed of thin sheets 22 and 24 in FIG. 2 of high strength-to-weight ratio material (not shown in FIG. 1), such as plastic and preferably a polyester film such as MYLAR. Each sheet is coated with a radiation absorptive and radiation emissive material, such as metal, preferably aluminum, and then etched to form a chain array of collectors 10, on one sheet 24, and radiators 12, on the other sheet 22, by any suitable standard coating and etching method. The sheets 22 and 24 are layered so that the collectors 10 and radiators 12 are displaced laterally (in Y direction as shown in FIG. 2) to achieve thermal isolation therebetween. The n— and p— doped thermoelectric elements 14 and 16 respectively, are placed between the sheets as shown in FIG. 2 for connecting the collectors and radiators and forming the thermoelectric chain as shown in FIG. 1. The thermal isolation between the collectors and radiators forces heat to flow from collectors through n— and p— thermoelectric elements to radiators. Any n— and p— doped thermoelectric material may be used but bismuth telluride ($Bi_2Te_3$) is preferred. The thickness Z, as shown in FIG. 2, of the array is approximately 0.1 millimeter.

Deep space acts as an infrared (IR) heat sink of about 3.5° K. The earth's horizon at a high altitude, for example 22 kilometers (km) or 70,000 feet, (this altitude has an attractive horizon for sensor operation), is 520 km and the total earth's surface subtended is approximately 851,000 km$^2$. The earth's ambient surface temperature is nominally 300° K. The peak radiation of the earth's albedo is at a wavelength of about 10 microns and radiance of about $1.1 \times 10^{-3}$ watts cm$^{-2}$SR$^{-1}$ (SR=steradian). Such a radiance produces an IR flux of approximately 0.056 watts/cm$^2$ on a body at 22 km altitude. Nominally, a bullet-shaped balloon of 28,320 m$^3$ would project an area to the earth's albedo of approximately 3077 m$^2$ at that altitude. This results in the balloon having a cross-section of $1.7 \times 10^6$ watts of IR power at a wavelength of 10 microns.

An array for mounting on the previously mentioned balloon is about 214 m$^2$ in size (or approximately three percent of the total vehicle surface area). However, the size of an array relative to a vehicle depends on the amount of power required by the vehicle.

The array mounts on a high-altitude platform so that the collectors face the earth and the radiators face space. The collectors absorb radiation from the earth and become heated thereby. The heat passes to the thermoelectric elements which convert some of the heat to electric power. The excess heat further passes to the radiators which emit the heat to space. The size of the area of the collectors and radiators controls the absorptivity of the collectors and the emissivity of the radiators, as explained hereinafter.

The area and absorptivity of the radiation collectors are controlled by the input power density:

$$(P_i/A_c) = W_a a \quad (1)$$

where:
P_i = input radiation power (watts)
$A_c$ = collector area (projected area from the earth in m²)
a = collector surface absorptance constant (ratio)
$W_a$ = radiant emittance (watts/m²) (albedo at 22 km altitude ≈ 560 watts/m², for example).

As previously mentioned, this power minus the power that is converted to electricity is radiated to space. Since the collectors are isolated laterally from the radiators, the thermal and electrical path is through the n— and p— doped thermoelectric elements where a Seebeck emf (electromotive force) is generated by the dissimilar n— and p— thermoelectric elements and the temperature difference between the collectors and the radiators. Thus, the collectors and radiators are emf conductors. The thermoelectric elements are the thermoconductive paths for conducting the thermo power from the collectors to the radiators.

The thermoelectric elements are constructed for providing a thermal path for the total input thermal power:

$$P_i = K_t A(dT/dx) \quad (2)$$

where:
$P_i$ = thermal power (heat entering a thermoelectric element in watts)
$K_t$ = thermal conductivity of the thermoelectric element material
A = cross sectional conductor area of the thermoelectric element normal to thermal flux (cm²)
(dT/dx) = thermal gradient (change in temperature across a thermoelectric element in degrees Kelvin/cm).

For Bismuth Telluride (Bi₂Te₃), the thermal conductivity (at 200° to 300° K.) is 0.015 watts/degree Kelvin-cm.

The radiators emit the excess thermal power, which is almost equal to the input radiation power, to space. The radiators operate under the same laws of thermodynamics as the collectors. However, the radiators face in the direction of space and operate at a lower temperature than the collectors. Therefore, the radiators must have an emissivity constant and a larger surface area than the collectors to compensate for the lower temperature of the radiators in order to emit the excess power as the collectors are absorbing the radiation power. The power radiated by the radiators is:

$$(P_o/A_e) = \sigma e T^4 \quad (3)$$

where:
$P_o$ = radiated thermal power (watts)
$A_e$ = radiator area (m²)
e = emissivity constant (ratio)
σ = Stefan-Boltzman constant (5.6697×10⁻⁸ watts m⁻² degrees K⁻⁴)
T = radiator temperature (degrees K.)

and $$P_o = P_i - P_e \quad (4)$$

where:

$P_e$ = thermoelectric power generated by the thermoelectric elements (about 2-6 percent conversion efficiency).

The open circuit voltages which are developed by the thermoelectric elements are a function of the Seebeck coefficients of the element p— and n— materials:

$$V = \int_{T_c}^{T_h} S_p dT - \int_{T_c}^{T_h} S_n dT \quad (5)$$

where
$S_p$ and $S_n$ = Seebeck coefficients of the p— and n— materials
$T_h$ = collector (hot) temperature
$T_c$ = radiator (cold) temperature.

These Seebeck coefficients are temperature dependent but have been characterized for most commonly used thermoelectric materials. The above equation may be reduced to the average Seebeck coefficient S, where $S = (S_p + S_n)/(2)$ multiplied by the temperature difference $(T_h - T_c)$, that is:

$$V = S(T_h - T_c).$$

The current and power output relations for each thermoelectric element become:

$$I = \frac{V_g}{(R_g + R_L)} \quad (6)$$

and $$P_e = \frac{V_g^2 R_L}{(R_g + R_L)^2} \quad (7)$$

where:
$V_g$ = open circuit voltage
$R_g$ = internal resistance into $R_L$
$R_L$ = load resistance (ohms).

At maximum efficiency the internal resistance is approximated by:

$$R_g = \frac{R_L}{\left(\sqrt{1 + Z\frac{T_h + T_c}{2}}\right)} \quad (8)$$

where the figure of merit, Z, is defined by:

$$Z = \frac{(S_n - S_p)^2}{(\sqrt{K_n \rho_n} + \sqrt{K_p \rho_p})^2} \quad (9)$$

where:
σ = resistivity of the thermoelectric element material
K = thermal conductivity of the thermoelectric element material.

For maximum efficiency, the dimensions of each element are defined as:

when $$L_n = L_p$$

then $$\frac{A_n}{A_p} = \sqrt{\frac{K_p \rho_n}{K_n \rho_p}} \qquad (10)$$

where:
L=length of the particular element
A=cross-sectional area of the element.
When the generator (comprising all the thermoelectric elements) resistance is established by:

$$R_c = (R_g/N)$$

N=number of elements in the generator;
the length-to-cross-sectional area ratios of the p— and n— thermoelectric elements are defined by:

$$\frac{L_n}{A_n} = \frac{R_g/N}{\rho_n + \frac{(\rho_p A_p)}{A_p}}; L_n = L_p \qquad (11)$$

and $$\frac{L_p}{A_p} = \frac{R_g/N}{\rho_p + \frac{(\rho_n A_p)}{A_n}}; L_n = L_p \qquad (12)$$

The actual physical size of the thermoelectric elements may be varied as long as the ratios are maintained.

The thermoelectric generator operating efficiency is expressed as the ratio of useful power delivered, $I^2R_L$, to rate of heat input. Optimizing $A_p/A_n$ and $R_g$ to $R_L$, the expression of optimum efficiency becomes:

$$\eta_{max} = \frac{T_h - T_c}{T_h} \cdot \frac{\sqrt{1 + Z(T_h + T_c)/2} - 1}{\sqrt{1 + Z(T_h + T_c)/2} + \frac{T_c}{T_h}} \qquad (13)$$

In effect, thermoelectric generators operate at 2.5 to 6.8% efficiency. Using equation (13) together with accepted values of $Bi_2Te_3$ in the range of operation for high-altitude platforms, such as that previously described, efficiencies of 3.4 to 4.2% are predicted. An array may be constructed with power density of approximately 148 to 183 Watts/kg that could operate from the albedo both day and night.

In addition to MYLAR, polyimides, polystyrene, paper, or cardboard may be used. In addition to aluminum, various metals can be used for the collector/radiator, such as copper, silver or gold. In addition to thermoelectric elements for power conversion, various thermodynamic cycles, such as Carnot, Brayden, etc., can be used with fluids to convert the heat to electric power.

Obviously many more modifications and variations of the present invention are possible in light of the above teachings. It is therefore to be understood that within the scope of the appended claims the invention may be practiced otherwise than as specifically described.

I claim:

1. A thermoelectric power converter for converting infrared radiation to electricity comprising:
a plurality of heat collectors for absorbing radiation;
a plurality of heat radiators arranged in lateral displacement with said collectors;
a plurality of thermoelectric elements of dissimilar metals, and alternating said dissimilar metals for interconnecting said collectors with said radiators, and said radiators with said collectors, and forming a series connection therewith for conducting electricity,
said radiation being absorbed by said collectors and being changed to heat, said heat flowing to said thermoelectric elements, said elements converting some of said heat to electricity, the remainder of said heat being radiated by said radiators, and said electricity flowing through said series connections of collectors, thermoelectric elements, and radiators.

2. A power converter as recited in claim 1 wherein said thermoelectric elements include n— and p— doped thermoelectric elements, and said series connection includes a first collector interconnected to a first radiator, said first radiator interconnected to a second collector, said second collector interconnected to a second radiator, and so on, each successive interconnection being accomplished by a thermoelectric element and said thermoelectric elements being alternate n— and p— doped elements,
said radiation being absorbed by said collectors and being changed to heat, said heat flowing to said n— and p— doped thermoelectric elements, said elements generating a Seebeck emf and converting some of said heat to electricity, the remainder of said heat being radiated by said radiators, and said electricity flowing through said series connections of collectors, thermoelectric elements, and radiators.

3. A power converter as recited in claim 1 wherein: said collectors and radiators are formed from a radiation absorptive and emissive material.

4. A power converter as recited in claim 1 wherein: said collectors and radiators are formed on a high strength-to-weight ratio material.

5. A power converter as recited in claim 2 wherein: said n— and P— doped thermoelectric elements are formed from bismuth telluride.

6. A power converter as recited in claim 3 wherein: said radiation absorptive and emissive material is metal.

7. A power converter as recited in claim 4 wherein: said high strength-to-weight ratio material is plastic.

8. A power converter as recited in claim 6 wherein: said metal is aluminum.

9. A power converter as recited in claim 7 wherein: said plastic is a polyester film.

10. A thermoelectric power converter for converting the infrared radiation from the earth's surface to electricity comprising:
a plurality of heat collectors for absorbing said radiation;
a plurality of heat radiators arranged in lateral displacement with said collectors;
a plurality of thermoelectric elements of dissimilar metals, and alternating said dissimilar metal for interconnecting said collectors with said radiation, and said radiators with said collectors, and forming a series connection therewith for conducting electricity,
said radiation from the earth's surface being absorbed by said collectors and being changed to heat, said heat flowing to said thermoelectric elements, said elements converting some of said heat to electricity, the remainder of said heat being radiated by said radiators, and said electricity flowing through said series connections of collectors, thermoelectric elements, and radiators.

11. A power converter as recited in claim 10 wherein:
said thermoelectric elements include n— and p— doped thermoelectric elements, and said series connection includes a first collector interconnected to a first radiator, said first radiator interconnected to a second collector, said second collector interconnected to a second radiator, and so on, each successive interconnection being accomplished by a thermoelectric element and said thermoelectric elements being alternate n— and p— doped elements, said radiation being absorbed by said collectors and being changed to heat, said heat flowing to said n— and p— doped thermoelectric elements, said elements generating a Seebeck emf and converting some of said heat to electricity, the remainder of said heat being radiated by said radiators, and said electricity flowing through said series connections of collectors, thermoelectric elements, and radiators.

12. A power converter as recited in claim 10 wherein:
said collectors and radiators are formed from a radiation absorptive and emissive material.

13. A power converter as recited in claim 10 wherein:
said collectors and radiators are formed on a high strength-to-weight ratio material.

14. A power converter as recited in claim 11 wherein:
said n— and p— doped thermoelectric elements are formed from bismuth telluride.

15. A power converter as recited in claim 12 wherein:
said radiation absorptive and emissive material is metal.

16. A power converter as recited in claim 13 wherein:
said high strength-to-weight ratio material is plastic.

17. A power converter as recited in claim 15 wherein:
said metal is aluminum.

18. A power converter as recited in claim 16 wherein:
said plastic is a polyester film.

19. A thermoelectric power converter for converting infrared radiation to electricity comprising:
a plurality of heat collectors for absorbing radiation;
a plurality of heat radiators arranged in lateral displacement with said collectors;
first thermoelectric means, electrically connecting each of said collectors to a radiator laterally displaced from said collector, for creating an EMF;
second thermoelectric means, electrically connecting each of said radiators to a collector laterally displaced from said radiator, for creating an EMF, wherein said collectors and said radiators are alternately interconnected by said first and said second thermoelectric means so that said first and said second thermoelectric means are connected in series;
wherein radiation is absorbed by said collectors and is changed to heat, said heat flowing to said first and said second thermoelectric means, said first and said second thermoelectric means converting some of said heat to electricity which flows through said series connection of collectors, thermoelectric means and radiators, while the remainder of said heat is radiated by said radiators.

20. A thermoelectric power converter as recited in claim 19 further comprising:
a first thin sheet upon which said plurality of collectors are disposed;
a second thin sheet upon which said plurality of radiators are disposed;
wherein said first and said second thin sheets are layered so that said collectors and said radiators are adjacently positioned between said thin sheets.

* * * * *